United States Patent [11] 3,616,049

[72] Inventors Vernon L. Moore;
Vado M. Hart, both of Bartlesville, Okla.
[21] Appl. No. 868,327
[22] Filed Oct. 22, 1969
[45] Patented Oct. 26, 1971
[73] Assignee Phillips Petroleum Company

[54] ETCHING APPARATUS
7 Claims, 2 Drawing Figs.

[52] U.S. Cl. .......... 156/345, 156/16
[51] Int. Cl. .......... C23f 1/02
[50] Field of Search .......... 156/16, 345; 261/113; 134/41, 115, 201; 222/193, 420

[56] References Cited
UNITED STATES PATENTS
2,766,482 10/1956 Heibel .......... 161/DIG. 7
3,436,286 4/1969 Lange .......... 156/345 X

*Primary Examiner*—William A. Powell
*Attorney*—Young and Quigg

ABSTRACT: An apparatus which emits etching solution as discrete drops upon an etchable surface including a tray having a channel position circumferential to an aperture extending through the floor of said tray.

PATENTED OCT 26 1971 3,616,049

INVENTORS
V. L. MOORE
V. M. HART

BY

Young & Quigg
ATTORNEYS

ETCHING APPARATUS

This invention relates to circuit board etching.

In one of its more specific aspects, this invention relates to a method and apparatus for etching copper printed circuit boards.

The etching of copper printed circuit boards is well known. One method involves the deposition of a copper plating on a suitable surface, printing a circuit pattern on the plating, and subjecting the printed surface to a chemical solution which removes from the surface all the copper except that beneath the printed pattern.

A variety of apparatus has been developed for carrying out the etching step. One apparatus positions the surface or surfaces to be etched in a vertical position and sprays etching solution on the surfaces, with or without movement of the board, covering the entire surface with the spray.

Another apparatus positions the surface in a horizontal position and causes the etching solution to flow downward onto the surface from an apertured drip tray into which the etching solution is continually introduced.

Both of these methods and their various modifications produce satisfactory results. It has now been determined, however, that the etching process can be appreciably shortened. The method and apparatus of this invention are directed to that improvement.

According to the method of this invention there is provided a process for etching a surface which comprises impinging and etching solution as discrete drops on the surface to create areas of concentrated etching action and lands of lesser etching action therebetween and flowing the solution over the lands as it flows from the tray.

According to the apparatus of this invention there is provided an etching tray having at least one aperture in its floor, the aperture adopted for dropwise discharge of a fluid from the tray through the floor, the aperture being encircled by a channel or groove formed in the lower surface of the floor.

Accordingly, it is an object of this invention to provide a circuit board etching process which requires a considerably shorter time to accomplish the required etching.

It is another object of this invention to provide an improved apparatus for etching circuit boards.

In one of its embodiments, this invention contemplates the employment of a tray from which the etching solution is discharged under conditions of gravity.

In another of its embodiments, this invention contemplates the employment of a tray from which the etching solution is discharged under pressure.

In these embodiments, it is preferable that the surface to be etched be horizontally disposed in the case of the gravitational discharge and be vertically disposed in the case of the pressure discharge.

Figure 1:
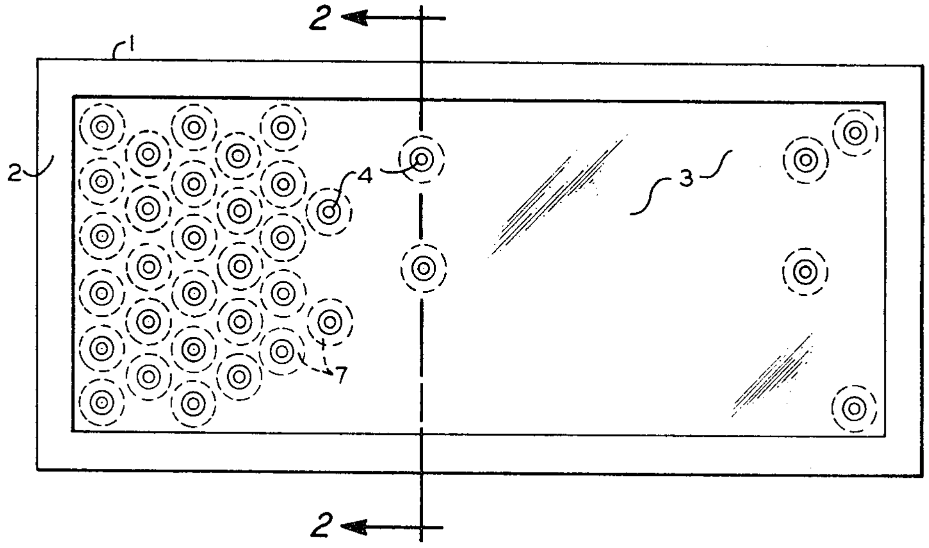
Figure 2:
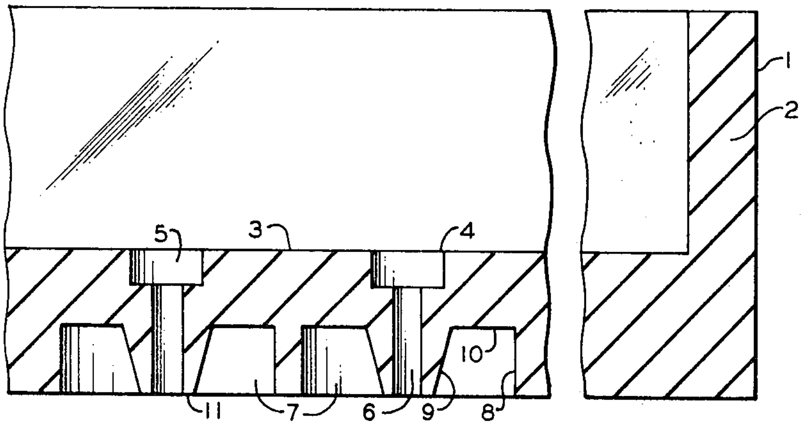

The method of this invention will be more easily understood if explained in conjunction with the attached drawings in which FIG. 1 illustrates one embodiment of the apparatus of this invention in plan view, and FIG. 2 illustrates in detail a feature of the apparatus of FIG. 1.

Referring now to FIG. 1 there is shown a plan view of the etching solution drip tray 1 bordered by wall 2 surrounding floor 3.

Floor 3 contains a multiplicity of apertures 4, preferably on triangular pitch, although any pattern can be employed. These apertures penetrate floor 3 such that etching solution introduced onto floor 3 of the tray passes through the apertures, falling on the surface of the board to be etched which is placed beneath the tray. The size of the tray and the number of apertures are related to the area to be etched. The area of the apertures will depend upon the nature of the solution and its viscosity, their area being of sufficient size to produce a dropwise flow through the apertures in contrast to the flow of a continuous stream of etching solution.

For example, a tray having a length of 15 inches, a width of 7 inches, and a depth of 1½ inches operates satisfactorily with a floor containing about 730 apertures of ⅛-inch diameter, in 19 rows on ⅜-inch spacing across its width and in 38 rows on ⅜-inch spacing across its length.

Referring now to FIG. 2, it will be seen that aperture 4 is composed of an upper section 5 and a lower section 6, lower section 6 being of smaller diameter than upper section 5, although the aperture may be of uniform diameter throughout its length.

Positioned peripheral to the lower portion 6 of aperture 4 is groove or channel 7. This groove is preferably an indentation having a vertical outer wall 8 and an angularly disposed inner wall 9, walls 8 and 9 being interconnected by base 10. However, this channel can be of any suitable configuration which acts to diminish the surface tension effect of the liquid emerging from the lower portion of aperture 4 and which acts to prevent the interconnecting or bridging of solution discharged from adjacent holes and so prevents the production of droplets larger than those emitted from the individual holes. Preferably, this groove will be positioned in concentric relationship to the lower extremity of the aperture penetrating floor 3.

While a large number of combinations of dimensions can be satisfactorily employed, a preferable embodiment is that in which dimensional relationships are as indicated below in respect to those features in FIG. 2 depicting single aperture 4 having upper section 5, lower section 6, with groove 7 having vertical wall 8, inner wall 9, and base 10, floor 11 lying between lower section 6 and wall 9:

| Item | Preferred Dimension, inches | Preferred Range of Dimension, inches |
|---|---|---|
| Height of Section 6 | 0.125 | 0.05–0.20 |
| Height of Section 5 | 0.125 | 0.05–0.20 |
| Diameter of Section 5 | 0.125 | 0.05–0.50 |
| Diameter of Section 6 | 0.025 | 0.01–0.20 |
| Height of Wall 8 | 0.094 | 0.05–0.25 |
| Height of Wall 9 | 0.10 | 0.05–0.30 |
| Length of Wall 10 | 0.10 | 0.05–0.30 |
| Length of Floor 11 | 0.0125 | 0.005–0.2 |

The apparatus of this invention can be employed in the horizontal position as is conventional. The individual, discrete drops which this tray produces are permitted to impinge upon the surface of the board to be etched, the surface of the board being maintained just above the upper level of the liquid in the reservoir in which the board is positioned. As a result, the individual drops, impinging on the board with concentrated force, act to speed the etching process in that immediate area on which they impinge such that the board is first etched in a pattern resembling the pattern of the etching tray itself. The areas, or lands, between the vertical projections of the apertures tend to be less effected by the impinging action of the drops but will be rapidly and completely etched thereafter as the solution flows from the surface of the board.

Comparative etching times have been determined employing the conventional process and apparatus which does not possess the circular recesses annular to the apertures as does the tray of this invention. The method and apparatus of this invention, under identical operating conditions, decreases the required etching time to about one-fifth of that required using the conventional process and apparatus.

While the apparatus of this invention is preferably employed under gravitational conditions of flow inducement, being positioned in a substantially horizontal position, it may also be employed in a substantially vertical position to discharge on a substantially vertical surface to be etched. Similarly, a plurality of such apparatus can be employed, either in the horizontal or vertical position, each discharging on a surface to be etched, the surfaces being stationary or moving. In the application of the apparatus and method of this invention in a substantially vertical position, the apertured surface is preferably employed as one wall of a chamber containing the etching fluid. Pressure, preferably pulsations, is applied to the chamber to cause emission of the etching fluid through the apertured wall in a dropwise manner for impingement on the surfaces to be etched.

It will be evident from the foregoing disclosure that various modifications can be made to the method and apparatus of this invention. However, such are considered as being within the scope of the invention.

What is claimed is:

1. An etching tray having a floor penetrated by at least one aperture, said aperture being adapted for the dropwise discharge of a fluid from said tray, the lower surface of said floor being adapted with a channel positioned circumferential to said aperture.

2. The apparatus as defined in claim 1 in which said aperture comprises a plurality of sections of different diameters.

3. The apparatus as defined in claim 1 in which said aperture comprises an upper and lower section, the upper section having a diameter of from about 0.05 to about 0.50 inch and the lower section having a diameter of from about 0.01 to about 0.20 inch.

4. The apparatus as defined in claim 1 in which said channel comprises a plurality of walls interconnected by a base.

5. The apparatus as defined in claim 4 in which one of said walls is angularly disposed and one of said walls is vertically disposed.

6. The apparatus as defined in claim 4 in which on said channel is positioned from said aperture by a distance from about 0.005 to about 0.2 inch.

7. The apparatus as defined in claim 6 in which said channel has a depth of from about 0.05 to about 0.25 inch.